(12) United States Patent
Tan

(10) Patent No.: US 7,893,733 B1
(45) Date of Patent: *Feb. 22, 2011

(54) VOLTAGE DRIVER CIRCUIT

(75) Inventor: Kien Beng Tan, Singapore (SG)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/502,475

(22) Filed: Jul. 14, 2009

Related U.S. Application Data

(63) Continuation of application No. 11/503,564, filed on Aug. 11, 2006, now Pat. No. 7,560,961.

(51) Int. Cl.
H03K 3/00 (2006.01)

(52) U.S. Cl. .................. 327/108; 327/111; 326/90; 326/92

(58) Field of Classification Search ......... 327/108–112; 326/82, 83, 89, 90, 92, 126, 128
See application file for complete search history.

(56) References Cited

U.S. PATENT DOCUMENTS

| | | | |
|---|---|---|---|
| 5,117,379 A | 5/1992 | Yanagiuchi et al. | |
| 5,237,216 A | 8/1993 | Hayano et al. | |
| 5,742,133 A | 4/1998 | Wilhelm et al. | |
| 7,233,165 B2 | 6/2007 | Jordy | |
| 7,560,961 B1 * | 7/2009 | Tan | 327/108 |

* cited by examiner

Primary Examiner—An T Luu

(57) ABSTRACT

A voltage driver circuit includes a first transistor. The first transistor includes a control terminal, a first terminal, and a second terminal. The second transistor includes a control terminal, a first terminal, and a second terminal. A first current source configured to provide a first bias current to the control terminal of the first transistor. A second current source configured to provide a second bias current to the control terminal of the second transistor. The first resistance includes a first terminal connected to the control terminal of the first transistor. The second resistance includes a first terminal connected to the control terminal of the second transistor. A capacitance connects the second terminal of the first transistor with the control terminal of the second transistor. A ratio of the first bias current to the second bias current is approximately equal to a ratio of the second resistance to the first resistance.

20 Claims, 5 Drawing Sheets

US 7,893,733 B1

VOLTAGE DRIVER CIRCUIT

CROSS-REFERENCE TO RELATED APPLICATIONS

This application is a continuation of U.S. patent application Ser. No. 11/503,564 filed on Aug. 11, 2006, now U.S. Pat. No. 7,560,961. The disclosure of the above application is incorporated herein by reference in its entirety.

FIELD

The present disclosure relates to voltage driver circuits.

BACKGROUND

Voltage driver circuits are used in many types of electronic devices. Some voltage driver circuits may need to provide a large voltage swing at high operating frequencies. Conventional voltage driver circuits for these high frequency applications tend to consume too much power.

SUMMARY

A voltage driver circuit comprises a first transistor having a control terminal and first and second terminals. A second transistor has a control terminal and first and second terminals and generates a drive voltage at the second terminal thereof. First and second current sources bias the control terminals of the first and second transistors with first and second variable current signals, respectively. A capacitance couples the second terminal of the first transistor with the control terminal of the second transistor.

In other features, a first resistance has one end that communicates with the control terminal of the first transistor. A second resistance has one end that communicates with the control terminal of the second transistor. Third and fourth current sources bias the second terminals of the first and second transistors, respectively. A ratio of current flowing through the first resistance to current through the second resistance equals a ratio of the second resistance to the first resistance. Current flowing through the second terminal of the second transistor is larger than current flowing through the second terminal of the first transistor.

In other features, time varying voltage at the second terminal of the second transistor is approximately equal to voltage at the second terminal of the first transistor. The first and second transistors comprise bipolar junction transistors. The first resistance is different than the second resistance. First and second time varying node voltage signals are substantially equal. A difference between a time varying first voltage at the second terminal of the second transistor and a second voltage at the second terminal of the first transistor is less than or equal to a base to emitter voltage of the first transistor.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
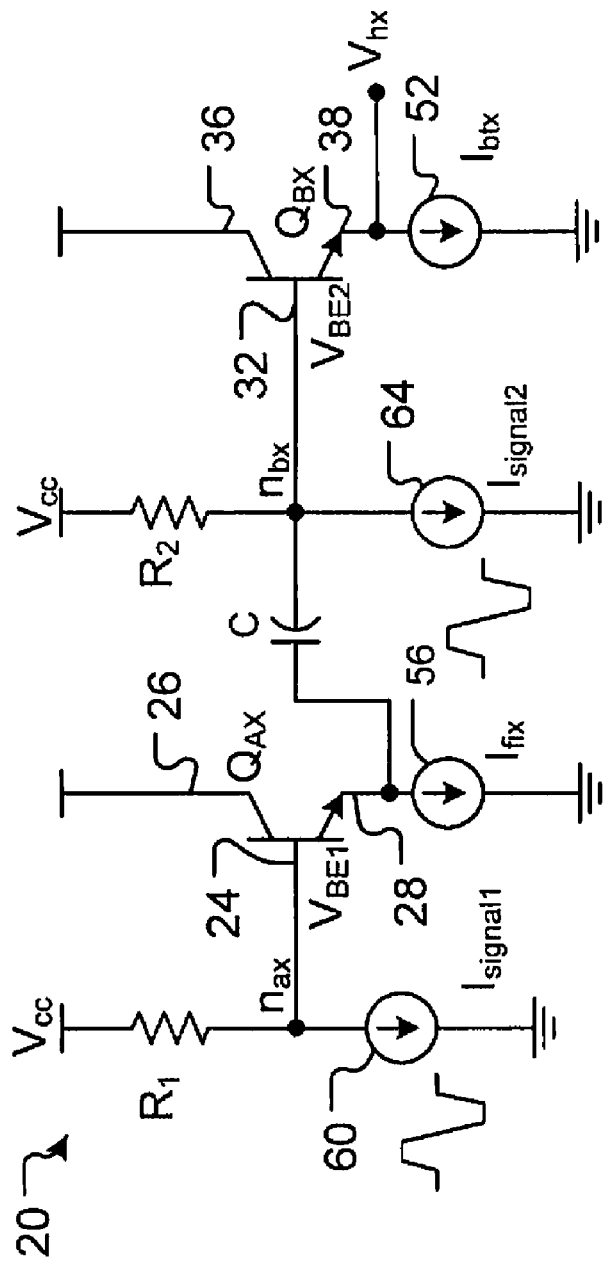
FIG. 1 is a circuit diagram of a voltage driver circuit in accordance with one implementation of the present disclosure.

The following description is merely exemplary in nature and is in no way intended to limit the disclosure, its application, or uses. For purposes of clarity, the same reference numbers will be used in the drawings to identify similar elements. As may be used herein, the phrase at least one of A, B, and C should be construed to mean a logical (A or B or C), using a non-exclusive logical or. It should be understood that steps within a method may be executed in different order without altering the principles of the present disclosure.

Referring now to FIG. 1, one implementation of a voltage driver circuit in accordance with the disclosure is indicated generally by reference number 20. The driver circuit 20 may be used to generate a drive voltage for a plurality of devices. The voltage driver circuit 20 includes two transistors $Q_{AX}$ and $Q_{BX}$. In the present implementation, the transistors $Q_{AX}$ and $Q_{BX}$ are bipolar junction npn transistors. In the following discussion when bipolar transistors are used, the base is the control terminal, the collector is the first terminal and the emitter is the second terminal. It is contemplated, however, that other types of transistors may be used.

The transistor $Q_{AX}$ includes a control terminal 24, a first terminal 26 and a second terminal 28. The transistor $Q_{BX}$ includes a control terminal 32, a first terminal 36 and a second terminal 38. The second terminal 28 of the transistor $Q_{AX}$ communicates with the control terminal 32 of the transistor $Q_{BX}$. An output is taken at the second terminal 38 of the transistor $Q_{BX}$. Other implementations also are contemplated, e.g., in which the first terminal 26 of the transistor $Q_{AX}$ and/or the first terminal 36 of the transistor $Q_{BX}$ are used as output terminal(s) with the current source replaced with impedance elements such as but not limited to resistors. An output voltage $V_{hx}$ may be delivered to the driven device at the second terminal 38 of the transistor $Q_{BX}$. The second terminal 38 of the transistor $Q_{BX}$ is biased by a constant current source 52 that provides a bias current $I_{btx}$. The second terminal 28 of the transistor $Q_{AX}$ is biased by a constant current source 56 that provides a bias current $I_{fix}$.

The transistors $Q_{AX}$ and $Q_{BX}$ may be of different sizes. In various implementations, the transistor $Q_{BX}$ can draw a larger current as compared to current drawn through the transistor $Q_{AX}$. In the present exemplary configuration, ten (10) times as much current may pass through the transistor $Q_{BX}$ as through the transistor $Q_{AX}$, although other current throughputs for either or both transistors are possible.

The control terminal 24 of the transistor $Q_{AX}$ is connected at a node $n_{ax}$ with a supply voltage $V_{cc}$ through an impedance, e.g., a resistance $R_1$. The control terminal 24 is also connected at the node $n_{ax}$ with a current source 60. The control terminal 32 of the transistor $Q_{BX}$ is connected at a node $n_{bx}$ with the supply voltage $V_{cc}$ through an impedance, e.g., a resistance $R_2$.

$R_1$ may be smaller that $R_2$. $R_1$ and $R_2$ may have the same or different resistance values. In the present configuration, the resistance $R_2$ may be larger than the resistance $R_1$. In some configurations, however, the resistance $R_2$ may be smaller than the resistance $R_1$. The control terminal 32 of the transistor $Q_{BX}$ is also connected at the node $n_{bx}$ to a current source 64. The second terminal 28 of the transistor $Q_{AX}$ is connected with the control terminal 32 of the transistor $Q_{BX}$ through a capacitance C.

In operation, the current source 60 provides a current signal $I_{signal1}$ and the current source 64 provides a current signal $I_{signal2}$. Signals $I_{signal1}$ and $I_{signal2}$ provide bias currents respectively at the control terminals 24 and 32. Additionally, $I_{signal1}$ and $I_{signal2}$ may have substantially the same time-varying waveform profile. In some implementations, the current signals vary between positive and negative current values. In the present implementation, the current signals $I_{signal1}$ and $I_{signal2}$ are applied in accordance with the following relationship:

$$\frac{I_{signal1}}{I_{signal2}} = \frac{R_2}{R_1}.$$

When configured and driven in the foregoing manner, the voltage driver circuit 20 exhibits the following characteristics. The signals $I_{signal1}$ and $I_{signal2}$ cause the nodes $n_{ax}$ and $n_{bx}$ to exhibit similar voltage levels and voltage swings. The capacitance C isolates the voltage difference between the nodes $n_{ax}$ and $n_{bx}$. Specifically, the capacitance C is charged to maintain the DC voltage difference between the node $n_{bx}$ and the second terminal 28. Because the nodes $n_{ax}$ and $n_{bx}$ exhibit similar voltage levels and voltage swings, the charge across the capacitance C representing this voltage difference remains relatively undisturbed.

The transistor $Q_{AX}$ throughputs a small current and so output impedance of $Q_{AX}$ driving the node $n_{bx}$ is low. Since the charge across the capacitance C is stable, the capacitance effects are small at node $n_{ax}$, and so $n_{ax}$ has a pole at a very high frequency. Accordingly, the signal $I_{signal1}$ has a high slew rate at the node $n_{ax}$. This high slew rate is mirrored to the node $n_{bx}$, which also has a pole at a high frequency. Thus the transistor $Q_{BX}$, which provides a large current output, acts as a slave to the transistor $Q_{AX}$. The large pull-up resistance $R_2$ keeps current small in the signal $I_{signal2}$.

Because current is small in $I_{signal2}$, little power is dissipated, thus enhancing efficiency of the driver circuit 20. Because there is little capacitance effect at the node $n_{ax}$ and small current and low input impedance at the node $n_{bx}$, the driver circuit 20 can be very fast, in that signal slew rates can be very fast at high frequencies at the nodes $n_{ax}$ and $n_{bx}$.

Various bias voltages, capacitance, currents and/or resistances of the driver circuit 20 may have different values in other configurations. The capacitance C may be configured such that the charge across the capacitance C remains stable.

It can be appreciated that $I_{signal1}$, $I_{signal2}$, $R_2$ and $R_1$ may be adjusted in various configurations, e.g., in accordance with the relationship described above to provide driver speed and efficiency. For example, the resistance $R_2$ may be increased to pull up smaller $I_{signal2}$ currents, thereby enhancing driver efficiency.

Voltage swings provided by the voltage driver circuit 20 are reduced by only one base-to-emitter voltage (e.g., voltage $V_{BE2}$ of the transistor $Q_{BX}$). In typical Darlington pair configurations, voltage swings are reduced by base-to-emitter voltages of at least two transistors. Thus the driver circuit 20 can provide a larger voltage swing than would be available from many comparable configurations currently in use. In addition, $V_{bx}$ DC voltage can be independently set without any power dissipation penalty or speed performance degradation.

Figure 2B:
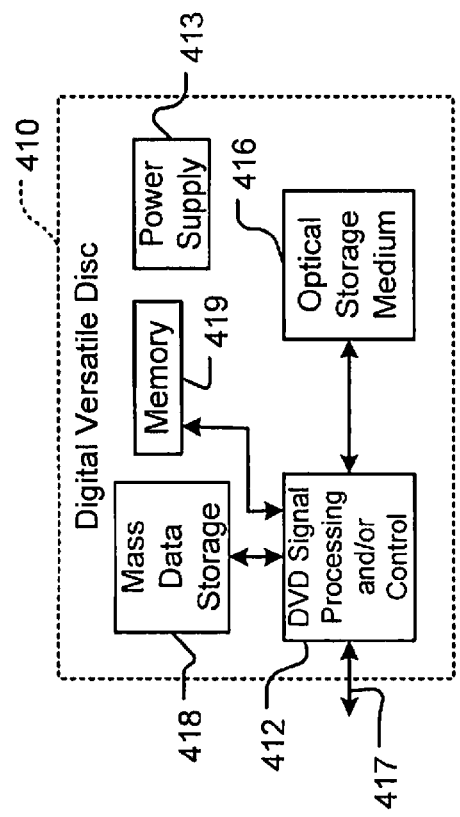
FIG. 2B is a functional block diagram of a digital versatile disk (DVD) in accordance with one implementation of the present disclosure.
Figure 2A:
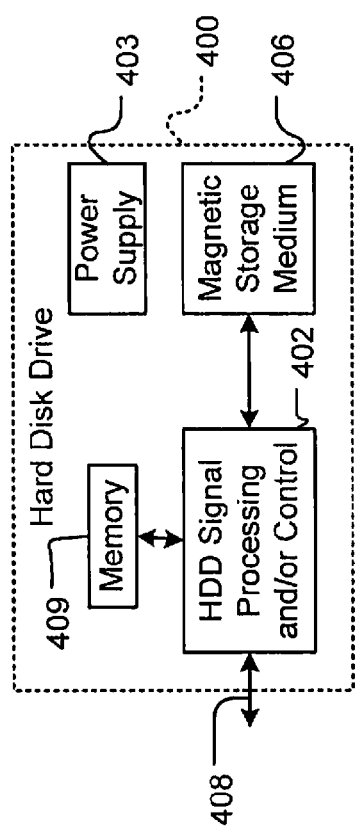
FIG. 2A is a functional block diagram of a hard disk drive in accordance with one implementation of the present disclosure.

Referring now to FIGS. 2A-2G, various exemplary implementations of the driver circuit 20 are shown. Referring now to FIG. 2A, various configurations of the voltage driver circuit 20 can be implemented in a hard disk drive (HDD) 400. The voltage driver circuit 20 may be implemented in signal processing and/or control circuits 402 and/or a power supply 403. In some implementations, the signal processing and/or control circuits 402 and/or other circuits (not shown) in the HDD 400 may process data, perform coding and/or encryption, perform calculations, and/or format data that is output to and/or received from a magnetic storage medium 406.

The HDD 400 may communicate with a host device (not shown) such as a computer, mobile computing devices such as personal digital assistants, cellular phones, media or MP3 players and the like, and/or other devices via one or more wired or wireless communication links 408. The HDD 400 may be connected to memory 409 such as random access memory (RAM), low latency nonvolatile memory such as flash memory, read only memory (ROM) and/or other suitable electronic data storage.

Referring now to FIG. 2B, the voltage driver circuit 20 can be implemented in a digital versatile disc (DVD) drive 410. The driver circuit 20 may be implemented in signal processing and/or control circuits 412, mass data storage of the DVD drive 410 and/or a power supply 413. The signal processing and/or control circuit 412 and/or other circuits (not shown) in the DVD DRIVE 410 may process data, perform coding and/or encryption, perform calculations, and/or format data that is read from and/or data written to an optical storage medium 416. In some implementations, the signal processing and/or control circuit 412 and/or other circuits (not shown) in the DVD DRIVE 410 can also perform other functions such as encoding and/or decoding and/or any other signal processing functions associated with a DVD drive.

The DVD drive 410 may communicate with an output device (not shown) such as a computer, television or other device via one or more wired or wireless communication links 417. The DVD drive 410 may communicate with mass data storage 418 that stores data in a nonvolatile manner. The mass data storage 418 may include a hard disk drive (HDD). The HDD may have the configuration shown in FIG. 2A. The HDD may be a mini HDD that includes one or more platters having a diameter that is smaller than approximately 1.8". The DVD DRIVE 410 may be connected to memory 419 such as RAM, ROM, low latency nonvolatile memory such as flash memory and/or other suitable electronic data storage.

Figure 2D:
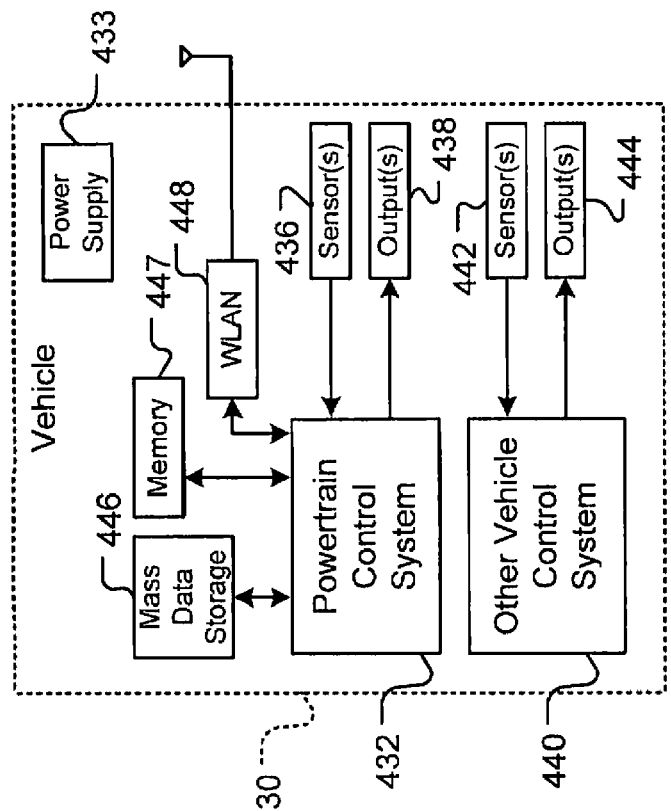
FIG. 2D is a functional block diagram of a vehicle control system in accordance with one implementation of the present disclosure.
Figure 2C:
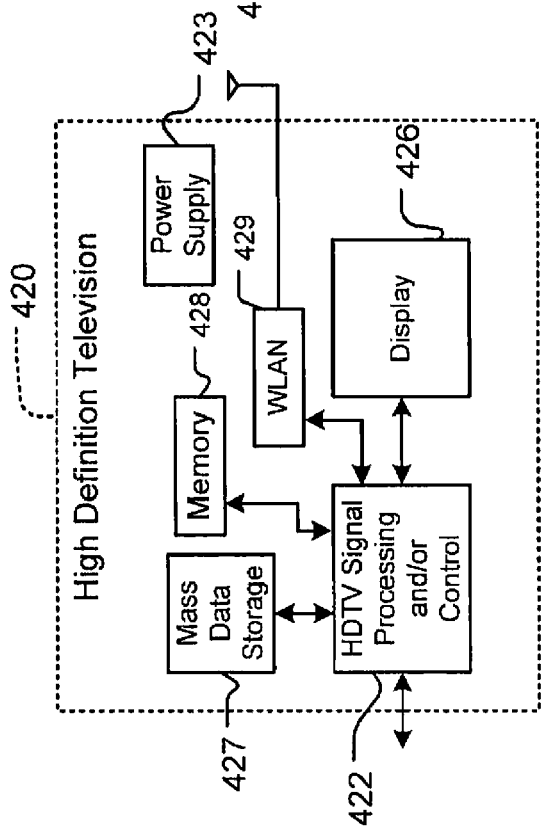
FIG. 2C is a functional block diagram of a high definition television in accordance with one implementation of the present disclosure.

Referring now to FIG. 2C, the voltage driver circuit 20 can be implemented in a high definition television (HDTV) 420. The driver circuit can be implemented in signal processing and/or control circuits 422, a WLAN interface 429, mass data storage 427 of the HDTV 420 and/or a power supply 423. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. At least one HDD may have the configuration shown in FIG. 2A and/or at least one DVD may have the configuration shown in FIG. 2B. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Referring now to FIG. 2D, the driver circuit 20 may be implemented in a control system of a vehicle 430, a WLAN interface 448, mass data storage 446 of the vehicle control system and/or a power supply 433. In some implementations, the driver circuit 20 may be implemented in a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The driver circuit 20 may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. At least one HDD may have the configuration shown in FIG. 2A and/or at least one DVD may have the configuration shown in FIG. 2B. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 2E:
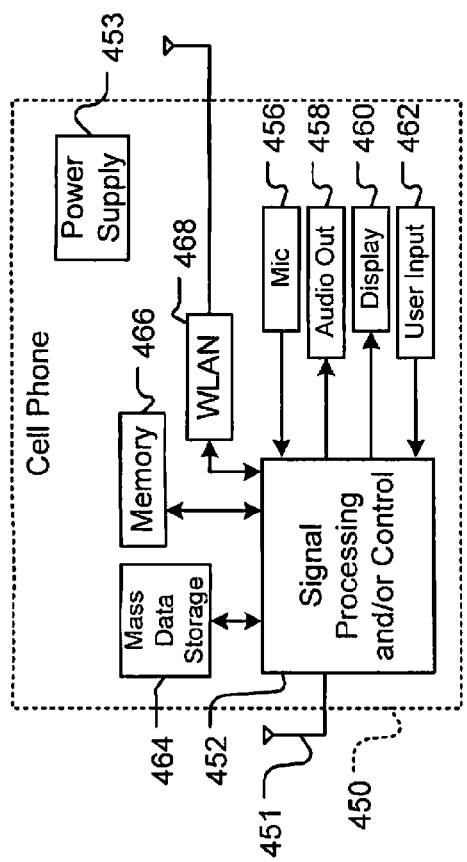
FIG. 2E is a functional block diagram of a cellular phone in accordance with one implementation of the present disclosure.

Referring now to FIG. 2E, the driver circuit 20 can be implemented in a cellular phone 450 that may include a cellular antenna 451. The driver circuit 20 may be implemented in signal processing and/or control circuits 452, a WLAN interface 468, mass data storage 464 of the cellular phone 450 and/or a power supply 453. In some implementations, the cellular phone 450 includes a microphone 456, an audio output 458 such as a speaker and/or audio output jack, a display 460 and/or an input device 462 such as a keypad, pointing device, voice actuation and/or other input device.

The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. At least one HDD may have the configuration shown in FIG. 2A and/or at least one DVD may have the configuration shown in FIG. 2B. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 2F:
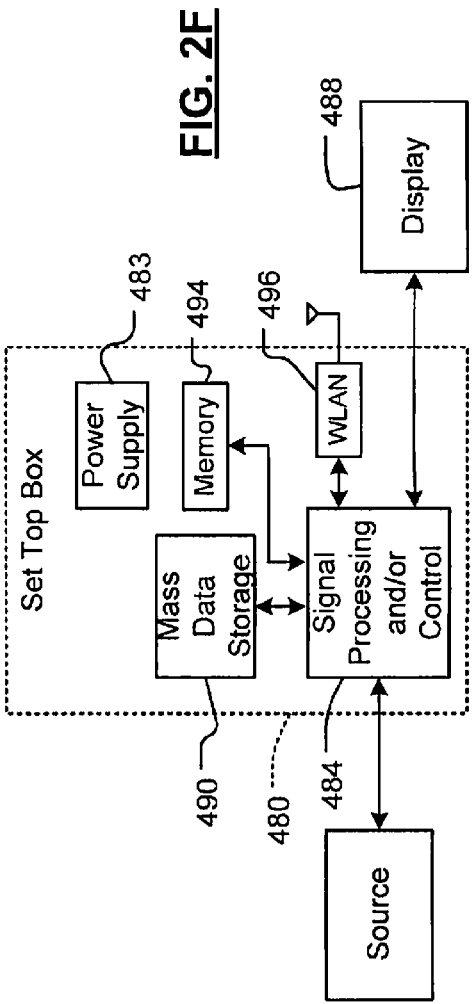
FIG. 2F is a functional block diagram of a set top box in accordance with one implementation of the present disclosure.

Referring now to FIG. 2F, the driver circuit 20 can be implemented in a set top box 480. The driver circuit 20 may be implemented in either or both signal processing and/or control circuits 484, a WLAN interface 496, mass data storage 490 of the set top box 480 and/or a power supply 483. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDDs and/or DVDs. At least one HDD may have the configuration shown in FIG. 2A and/or at least one DVD may have the configuration shown in FIG. 2B. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Figure 2G:
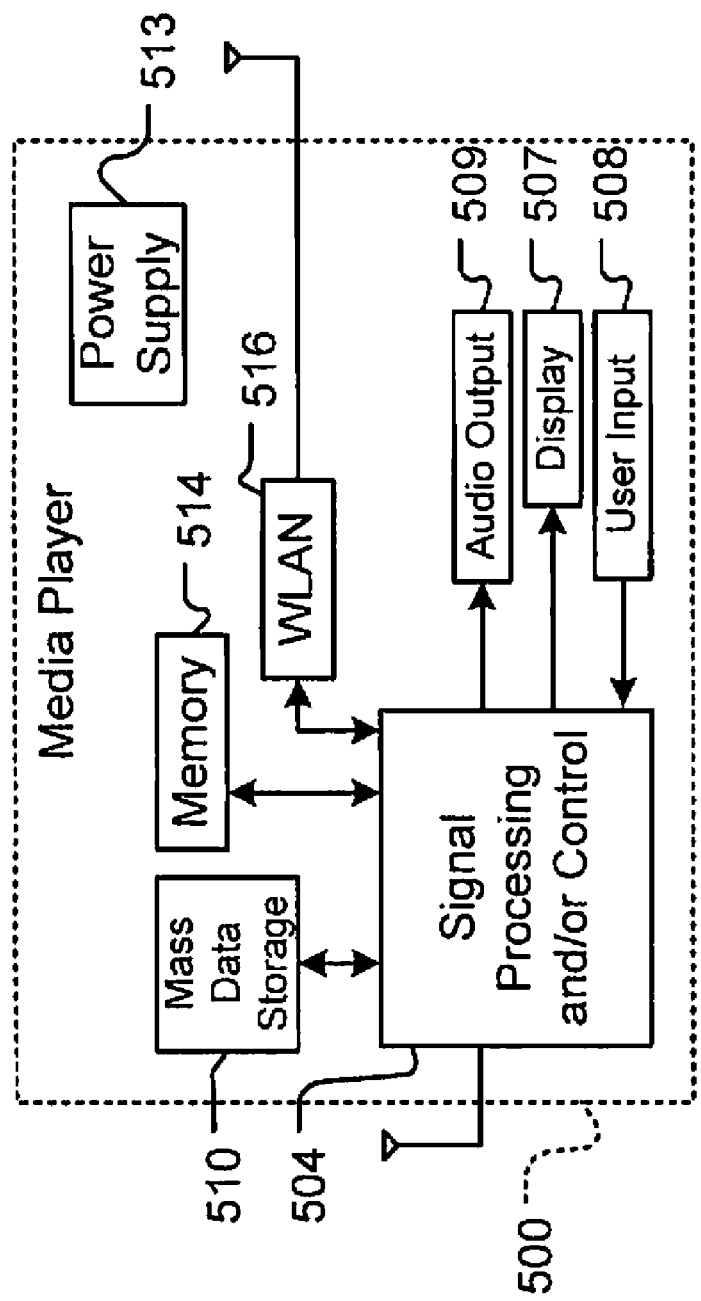
FIG. 2G is a functional block diagram of a media player in accordance with one implementation of the present disclosure.

Referring now to FIG. 2G, the driver circuit 20 can be implemented in a media player 500. The driver circuit 20 may be implemented in signal processing and/or control circuits 504, a WLAN interface 516, mass data storage 510 of the media player 500 and/or a power supply 513. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example HDDs and/or DVDs. At least one HDD may have the configuration shown in FIG. 2A and/or at least one DVD may have the configuration shown in FIG. 2B. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A voltage driver circuit comprising:
   a first transistor, the first transistor including a control terminal, a first terminal, and a second terminal;
   a second transistor, the second transistor including a control terminal, a first terminal, and a second terminal;
   a first current source configured to provide a first bias current to the control terminal of the first transistor;
   a second current source configured to provide a second bias current to the control terminal of the second transistor;
   a first resistance, the first resistance including a first terminal connected to the control terminal of the first transistor;
   a second resistance, the second resistance including a first terminal connected to the control terminal of the second transistor; and
   a capacitance connecting the second terminal of the first transistor with the control terminal of the second transistor,
   wherein a ratio of the first bias current to the second bias current is approximately equal to a ratio of the second resistance to the first resistance.

2. The voltage driver circuit of claim 1, wherein:
   the first bias current has a first time-varying waveform profile;
   the second bias current has a second time-varying waveform profile; and
   the first time-varying waveform profile is substantially the same as the second time-varying waveform profile.

3. The voltage driver circuit of claim 1, wherein each of the first bias current and the second bias current varies over time between a positive value and a negative value.

4. The voltage driver circuit of claim 1, wherein current flowing through the second terminal of the second transistor is larger than current flowing through the second terminal of the first transistor.

5. The voltage driver circuit of claim 1, wherein the second transistor is configured to generate a drive voltage.

6. The voltage driver circuit of claim 1, further comprising:
   a third current source configured to bias the second terminal of the first transistor; and
   a fourth current sources configured to bias the second terminal of the second transistor.

7. The voltage driver circuit of claim 1, wherein each of the first transistor and the second transistor comprises a bipolar junction transistor.

8. The voltage driver circuit of claim 1, wherein a first voltage at the second terminal of the second transistor is substantially equal to a second voltage at the second terminal of the first transistor.

9. The voltage driver circuit of claim 1, wherein a difference between a first voltage at the second terminal of the second transistor and a second voltage at the second terminal of the first transistor is less than or equal to a voltage between the control terminal of the first transistor and the second terminal of the first transistor.

10. A voltage driver circuit comprising:
    a first transistor, the first transistor including a control terminal, a first terminal, and a second terminal;
    a second transistor, the second transistor including a control terminal, a first terminal, and a second terminal;
    a first current source configured to provide a first bias current to the control terminal of the first transistor, the first bias current having a first waveform profile;
    a second current source configured to provide a second bias current to the control terminal of the second transistor, the second bias current having a second waveform profile that is substantially synchronized with the first waveform profile of the first bias current; and
    a capacitance connecting the second terminal of the first transistor with the control terminal of the second transistor,
    wherein each of the first bias current and the second bias current varies over time between positive and negative values.

11. The voltage driver circuit of claim 10, further comprising:
    a first resistance, the first resistance including a first terminal connected to the control terminal of the first transistor; and
    a second resistance, the second resistance including a first terminal connected to the control terminal of the second transistor.

12. The voltage driver circuit of claim 10, wherein current flowing through the second terminal of the second transistor is larger than current flowing through the second terminal of the first transistor.

13. The voltage driver circuit of claim 10, wherein the second transistor is configured to generate a drive voltage.

14. The voltage driver circuit of claim 10, further comprising:
    a third current source configured to bias the second terminal of the first transistor; and
    a fourth current source configured to bias the second terminal of the second transistor.

15. The voltage driver circuit of claim 10, wherein each of the first transistor and the second transistor comprises a bipolar junction transistor.

16. The voltage driver circuit of claim 10, wherein a first voltage at the second terminal of the second transistor is substantially equal to a second voltage at the second terminal of the first transistor.

17. The voltage driver circuit of claim 10, wherein a difference between a first voltage at the second terminal of the second transistor and a second voltage at the second terminal of the first transistor is less than or equal to a voltage between the control terminal of the first transistor and the second terminal of the first transistor.

18. The voltage driver circuit of claim 10, wherein:
the first bias current has a waveform profile that is substantially the as same as and synchronized to a waveform profile of the second bias current; and
each of the first bias current and the second bias current varies over time.

19. A device comprising the voltage driver circuit of claim 1.

20. A voltage driver circuit comprising:
a first transistor, the first transistor including a control terminal, a first terminal, and a second terminal;
a second transistor, the second transistor including a control terminal, a first terminal, and a second terminal;
a first current source configured to provide a first bias current to the control terminal of the first transistor;
a second current source configured to provide a second bias current to the control terminal of the second transistor;
a first resistance, the first resistance including a first terminal connected to the control terminal of the first transistor;
a second resistance, the second resistance including a first terminal connected to the control terminal of the second transistor;
a third current source configured to bias the second terminal of the first transistor;
a fourth current source configured to bias the second terminal of the second transistor;
a capacitance connecting the second terminal of the first transistor with the control terminal of the second transistor; and
an output connected to the second terminal of the second transistor,
wherein a difference between a first voltage at the second terminal of the second transistor and a second voltage at the second terminal of the first transistor is less than or equal to a voltage between the control terminal of the first transistor and the second terminal of the first transistor.

* * * * *